(12) United States Patent
Jiang et al.

(10) Patent No.: US 8,445,798 B2
(45) Date of Patent: May 21, 2013

(54) USB CONNECTOR COVER AND ELECTRONIC DEVICE USING THE SAME

(75) Inventors: Wan-Jun Jiang, Shenzhen (CN); Chun-Wei Pan, New Taipei (TW); Gang Wang, Shenzhen (CN); Hui Yuan, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 144 days.

(21) Appl. No.: 13/205,624

(22) Filed: Aug. 9, 2011

(65) Prior Publication Data

US 2012/0171899 A1 Jul. 5, 2012

(30) Foreign Application Priority Data

Dec. 30, 2010 (CN) .......................... 2010 1 0614528

(51) Int. Cl.
  *H01R 24/00* (2011.01)
(52) U.S. Cl.
  USPC ................ 200/51.11; 200/43.04; 200/341; 200/51 R; 439/509; 439/135
(58) Field of Classification Search ........... 200/51 R, 200/51.11, 51.12, 51.16, 333, 42.02, 42.04, 200/42.05; 439/507, 509, 511, 135, 144, 439/148

See application file for complete search history.

(56) References Cited

U.S. PATENT DOCUMENTS

| | | | | |
|---|---|---|---|---|
| 3,493,915 A | * | 2/1970 | Cox | 439/511 |
| 7,713,083 B1 | * | 5/2010 | Sun et al. | 439/507 |
| 8,066,526 B2 | * | 11/2011 | Gentner et al. | 439/511 |
| 2008/0194138 A1 | * | 8/2008 | Wu et al. | 439/507 |
| 2010/0033913 A1 | * | 2/2010 | Cao | 439/135 |
| 2012/0088398 A1 | * | 4/2012 | Sun | 439/507 |

\* cited by examiner

*Primary Examiner* — Felix O Figueroa
(74) *Attorney, Agent, or Firm* — Altis Law Group, Inc.

(57) ABSTRACT

A cover for mounting to a Universal Serial Bus (USB) electronic device, the USB electronic device includes a shell defining an opening and a USB connector exposed at the opening. The USB connector includes a GND pin and an ID pin. The cover includes a main body and an elastomeric push button; the main body engagably attaches to the shell and covers the opening; the elastomeric push button is formed on the main body and is configured for powering on or off the USB electronic device; the elastomeric push button includes two metal pins connected with each other and configured for short-circuiting the GND pin to the ID pin when the elastomeric push button is depressed.

2 Claims, 6 Drawing Sheets

USB CONNECTOR COVER AND ELECTRONIC DEVICE USING THE SAME

BACKGROUND

1. Technical Field

The present disclosure relates to an electronic device, and particularly, to a USB electronic device including an interface cover.

2. Description of Related Art

Many electronic devices have an interface, like an USB interface, which uses an interface cover to protect the interface. However, the interface cover can only be used to keep the USB interface free from dust and water. Therefore, what is needed is an interface cover to overcome the problems mentioned above.

BRIEF DESCRIPTION OF THE DRAWINGS

The components in the drawings are not necessarily drawn to scale, the emphasis instead being placed upon clearly illustrating the principles of an electronic device with an interface cover. Moreover, in the drawings, like reference numerals designate corresponding parts throughout the several views.

DETAILED DESCRIPTION

Figure 1:
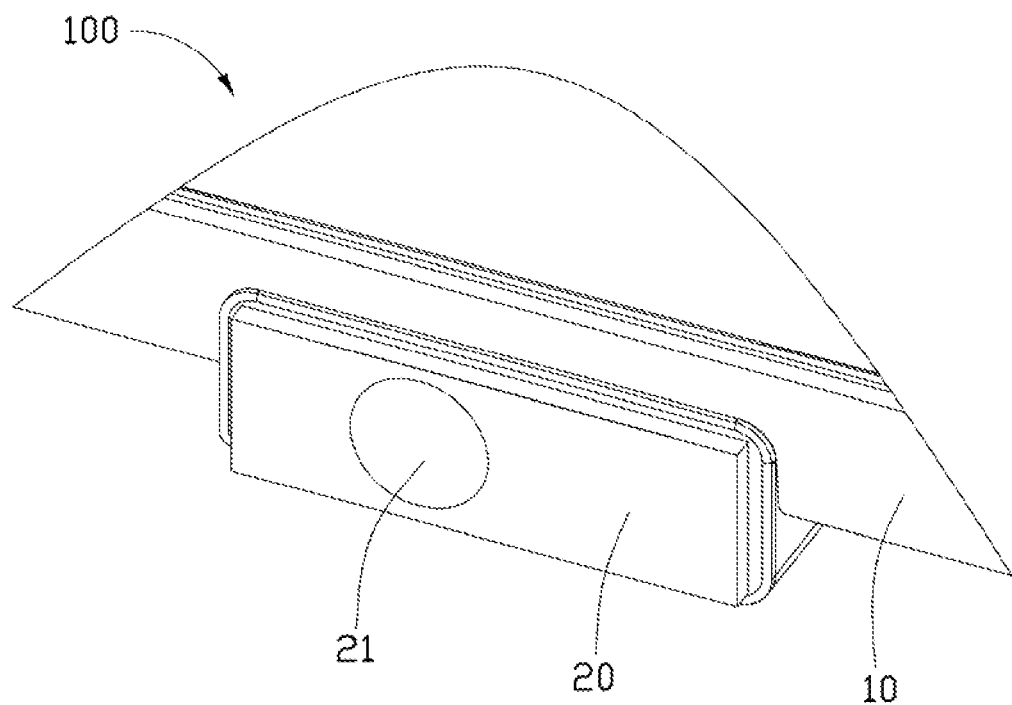
FIG. 1 is a schematic, isometric view showing a cover on a partial view of a USB electronic device in accordance with one exemplary embodiment.

Referring to FIG. 1, a Universal Serial Bus (USB) electronic device 100 includes a shell 10 and a cover 20 attached to the shell 10.

Figure 2:
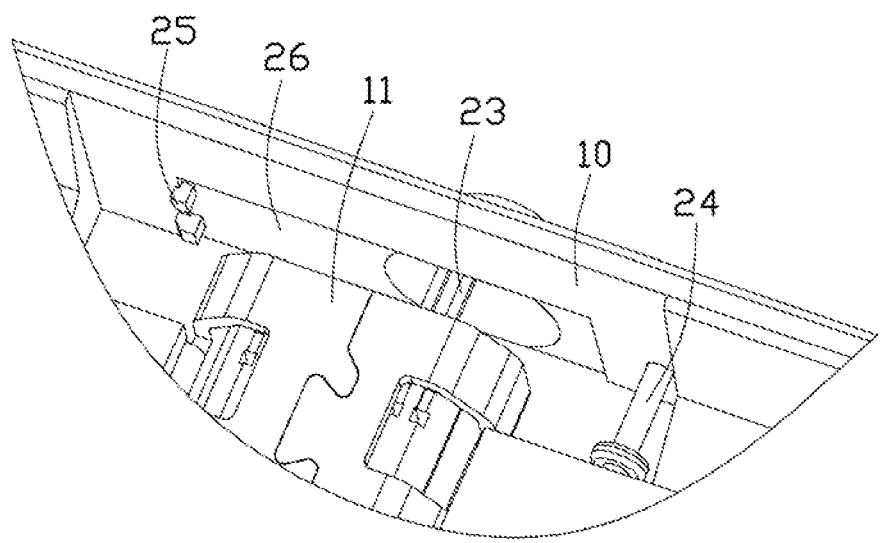
FIG. 2 is a schematic, perspective view showing an inside of the cover on the partial view of the USB electronic device of FIG. 1.
Figure 4:
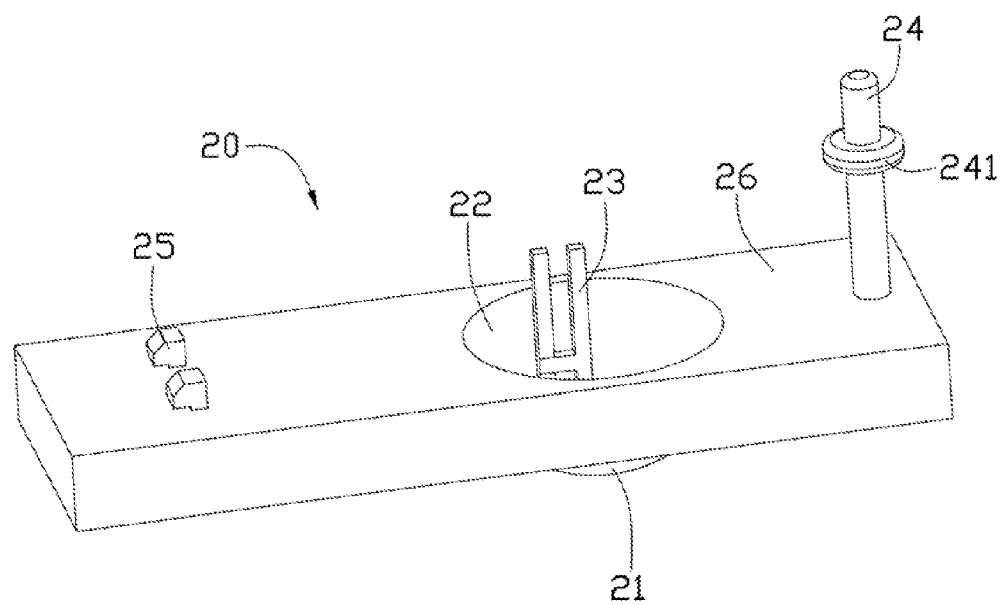
FIG. 4 is a schematic, isometric view showing a cover in accordance with one exemplary embodiment.

Referring to FIG. 2 and FIG. 4, an USB connector 11 is covered by the cover 20 attached to the shell 10. A projection 24 is mounted on a main body 26 of the cover 20, and a convex edge 241 is positioned on the end part of the projection 24 to fix the cover 20 to the shell 10. A hook 25 is mounted on the main body 26, when the cover 20 covers the USB connector 11, the hook 25 can fix the other end of the cover 20 to the shell 10. The hook 25 can be detached from the shell 10 to expose the USB connector 11 when a user wants to connect a peripheral device (not shown) to the USB electronic device 100 through the USB connector 11. A space (not shown) is reserved between the shell 10 and the end with the hook 25 to allow the user to detach the hook 25 and dig out the cover 20 from the shell 10.

Figure 3:
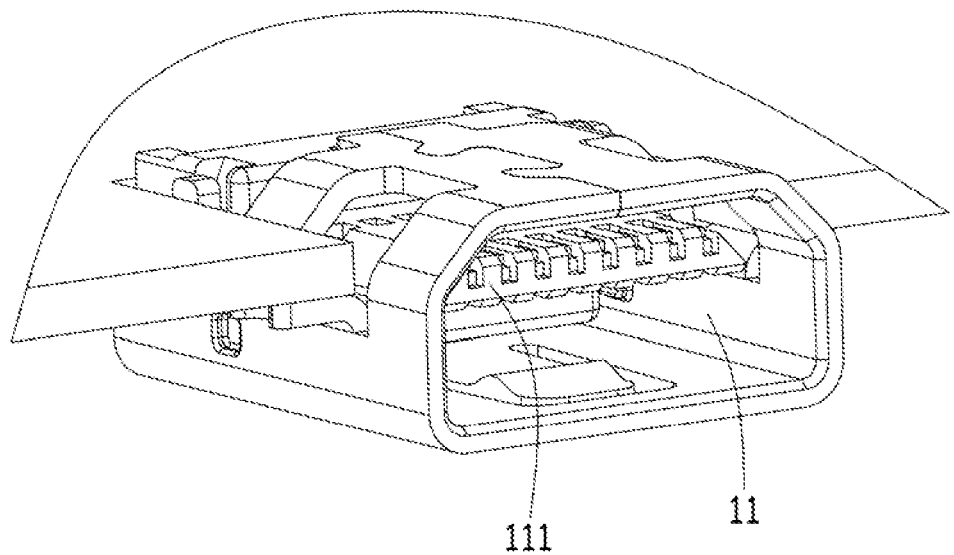
FIG. 3 is a schematic, isometric view showing a USB connector of a USB electronic device in accordance with one exemplary embodiment.

Referring to FIG. 3, the USB connector 11 includes a number of pins 111, the pins 111 include a GND pin and an ID pin.

Referring to FIG. 4, an elastomeric push button 21 is set on the cover 20. A recess 22 is formed on the corresponding inner side surface of the elastomeric push button 21 to allow the user to push the elastomeric push button 21 toward the inner side of the elastomeric push button 21. Two metal pins 23 are connected together and mounted on the recess 22. When the elastomeric push button 21 is pressed, the two metal pins 23 contact to the GND pin and the ID pin of the pins 111 of the USB connector 11 respectively to short-circuit the ID pin to the GND pin; when the elastomeric push button 21 is released, the two metal pins 23 are detached from the pins 111. In the present embodiment, the two metal pins 23 may be H-shaped or U-shaped.

Figure 5:
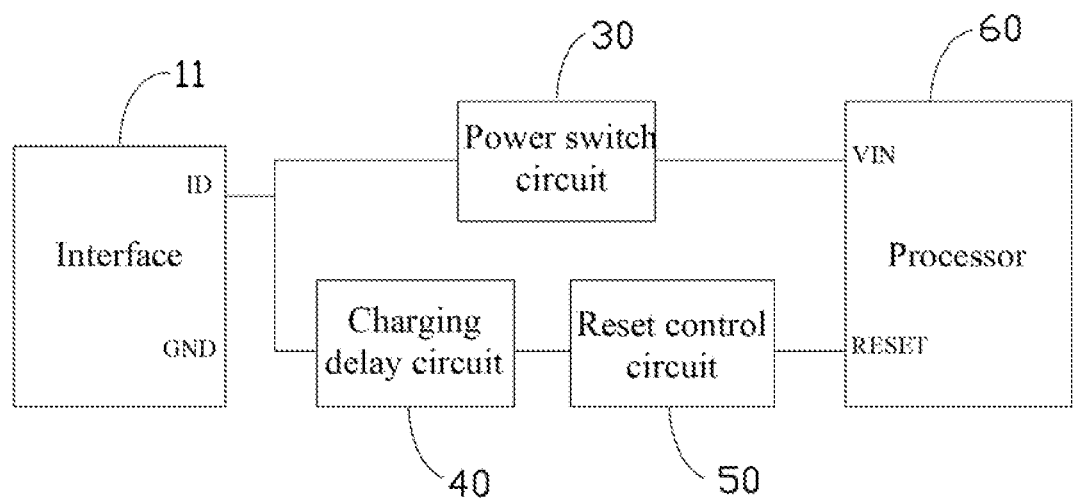
FIG. 5 is a block diagram of the USB electronic device of FIG. 1.

Referring to FIG. 5, the USB electronic device 100 includes a power switch circuit 30, a delay circuit 40, a reset circuit 50, and a processor 60. The ID pin of the USB connector 11 is connected to a voltage input pin (VIN) of the processor 60 through the power switch circuit 30; when the user presses the elastomeric push button 21, the ID pin is grounded through the GND pin and at a low voltage level, and the power switch circuit 30 generates a power-on signal or a power-off signal to the VIN of the processor 60 to enable the processor 60 to switch the power of the USB electronic device 100.

The ID pin of the USB connector 11 is further connected to a RESET pin of the processor 60 through the delay circuit 40 and the reset circuit 50. When the elastomeric push button 21 is pressed, the delay circuit 40 begins to charge and outputs a voltage to the reset circuit 50; when the elastomeric push button 21 is pressed for over a period of time, the reset circuit 50 generates a RESET control signal to the processor 60 through the RESET pin to allow the processor 60 to restart the USB electronic device 100.

Figure 6:
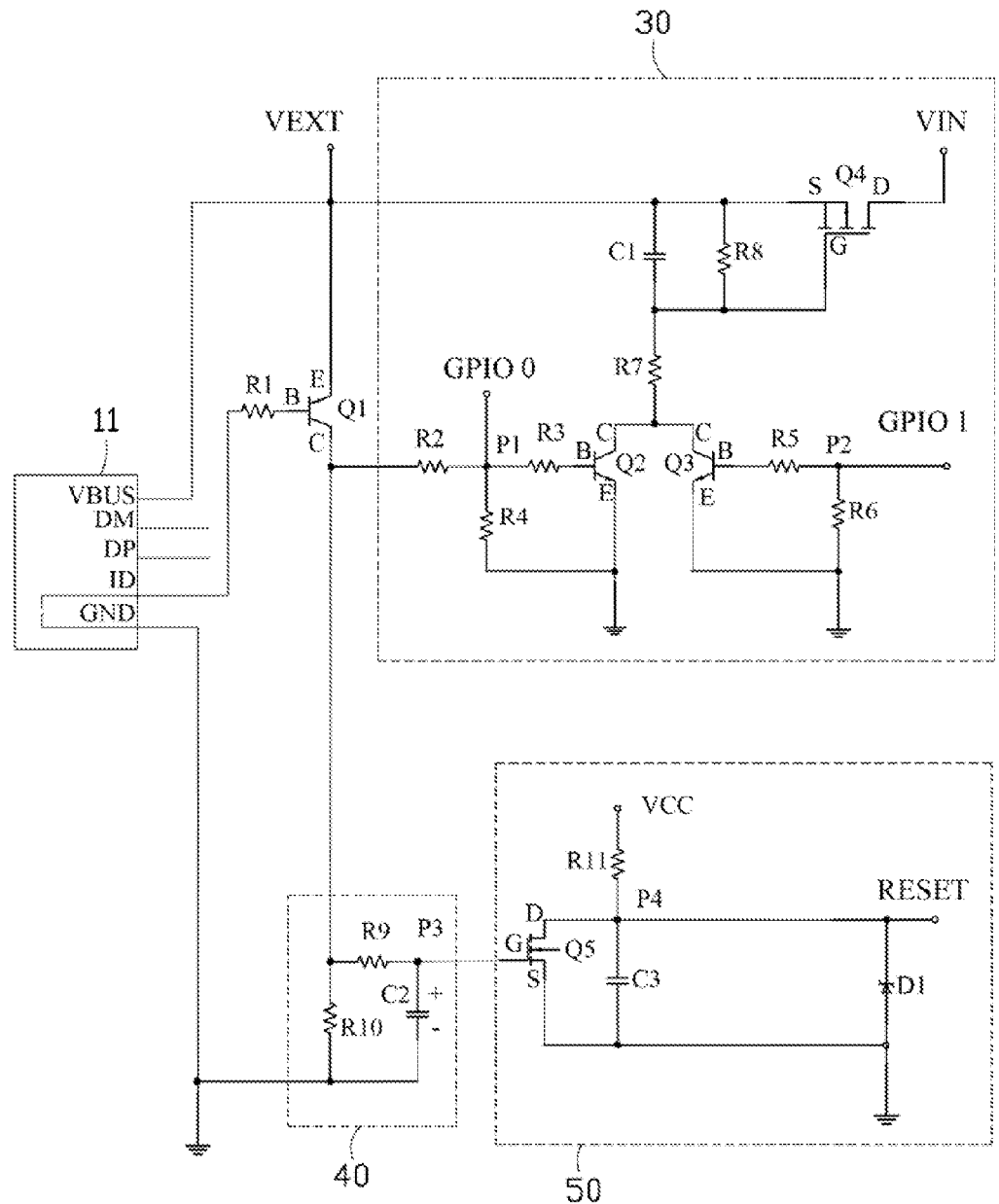
FIG. 6 is a circuit of the USB electronic device of FIG. 1.

Referring to FIG. 6, the ID pin of the USB connector 11 is connected with a +5V standby voltage output terminal (VEXT) through a resistor R1 and a switch Q1. In the present embodiment, the switch Q1 is a pnp transistor; a base of the switch Q1 is connected with the ID pin of the USB connector 11 through the resistor R1; an emitter of the Q1 is connected with the VEXT.

The power switch circuit 30 includes a switch Q2, a switch Q3, and a switch Q4. In the present embodiment, the switch Q2 and the switch Q3 are npn transistors, and the switch Q4 is a pMOSFET. A base of the switch Q2 is connected with a collector of the switch Q1 through a resistor R3 and a resistor R2, and a voltage detection node P1 between the resistor R2 and the resistor R3 is connected with a general purpose I/O 0 (GPIO 0); an emitter of the switch Q2 is grounded and connected to the base of the switch Q2 through a resistor R4 and a resistor R3. A base of the switch Q3 is connected to an emitter of the switch Q3 through a resistor R5 and a resistor R6, and a voltage input node P2 between the resistor R5 and the resistor R6 is connected with a general purpose I/O 1 (GPIO 1). The emitter of the switch Q3 is grounded, and collectors of the switch Q2 and the switch Q3 are connected to a source of the switch Q4 through a resistor R7, a resistor R8, and a parallel branch of a capacitor C1; the collectors of the switch Q2 and the switch Q3 are further connected with a gate of the switch Q4 through the resistor R7. A drain of the switch Q4 is connected with the VIN of the processor 60, and the source of the switch Q4 is further connected to the VEXT.

When the elastomeric push button 21 is pressed, the ID pin and the GND pin of the USB connector 11 is connected through the two metal pins 23 of the cover 20; the ID pin of the USB connector 11 is grounded through the GND pin and at a low voltage level, and thus the base of the switch Q1 obtains a low voltage level. When the base of the switch Q1 is at a low voltage level, the switch Q1 is closed, and the base of the switch Q2 and the voltage input node P2 are connected to the VEXT to be at a high voltage level; when base of the switch Q2 is at a high voltage level, the switch Q2 is closed. The GPIO 1 outputs a 3.3V power-on voltage to the voltage input node P2 when the high voltage level of the voltage detection node P1 is detected by the GPIO 0, and the base of the switch Q3 obtains a high voltage level to close the switch Q3. When the switch Q3 is closed, the switch Q4 is closed to allow the VEXT to connect to the VIN of the processor 60. The VIN obtains a +5V voltage from the VEXT and the USB electronic device 100 is booted when the switch Q4 is closed. When the elastomeric push button 21 is released, the ID pin is disconnected from the GND pin and opens the switch Q1; the voltage detection node P1 is at a low voltage level to open the switch Q2; the GPIO 1 outputs a 3.3V sustained voltage to maintain the power of the USB electronic device 100.

When the elastomeric push button 21 is pressed while the USB electronic device 100 is on, the GPIO 0 detects the high voltage level of the voltage detection node P1, and the GPIO 1 outputs a 0V power-off voltage to the voltage input node P2 to open the switch Q3. When the elastomeric push button 21 is released, the switch Q2 is open to open the switch Q4. The +5V voltage from the VEXT to the VIN is cut off and the USB electronic device 100 is shutdown.

The delay circuit 40 includes a capacitor C2; a negative electrode of the capacitor C2 is grounded and a positive electrode of the capacitor C2 is connected with the collector of the switch Q1 through a resistor R9; the positive electrode further connects to the negative electrode through the resistor R9 and the resistor R10. A voltage output terminal P3 is formed between the positive electrode and the resistor R9.

The reset circuit 50 includes a switch Q5; in the present embodiment, the switch Q5 is an nMOSFET. A gate of the switch Q5 is connected with the voltage output terminal P3 of the delay circuit 40; a source of the switch Q5 is grounded; a drain of the Q5 is connected with a power terminal VCC through a pull-up resistor R11. A voltage output terminal P4 formed between the drain and the resistor R11 is connected with the RESET pin of the processor 60, and grounded through a capacitor C3 or a zener diode D1. The processor 60 restarts the system when the RESET pin is at a low voltage level.

When the elastomeric push button 21 is pressed, the switch Q1 is closed and the capacitor C2 is connected to the VEXT to be charged through the resistor R9 and the switch Q1; the voltage output terminal P3 reaches a pre-determined threshold of voltage when the elastomeric push button 21 is pressed for over a period of time, and the switch Q5 is closed when the voltage output terminal P3 reaches a pre-determined threshold of voltage; when the switch Q5 is closed, the voltage output terminal P4 is grounded to allow the RESET pin of the processor 60 to obtain a low voltage level, and the processor 60 restarts the USB electronic device 100. When the elastomeric push button 21 is released, the ID pin is disconnected from the GND pin and the capacitor C2 discharges through the resistor R9 and the resistor R10 to lower the voltage of the voltage output terminal P3, and the switch Q5 is open; the voltage output terminal P4 obtains a high voltage level from the power terminal VCC through the resistor R11, and the RESET pin of the processor 60 obtains a high voltage level from the voltage output terminal P4.

Therefore, the elastomeric push button 21 is capable of switching the power of the USB electronic device 100 as well as protecting the USB connector 11. The user can switch the power of the USB electronic device 100 when pressing the elastomeric push button 21, and restart the USB electronic device 100 when long pressing the elastomeric push button 21.

Although the present disclosure has been specifically described on the basis of the exemplary embodiment thereof, the disclosure is not to be construed as being limited thereto. Various changes or modifications may be made to the embodiment without departing from the scope and spirit of the disclosure.

What is claimed is:

1. A cover for mounting to a Universal Serial Bus (USB) electronic device, the USB electronic device including a shell defining an opening and a USB connector exposed at the opening, the USB connector including a GND pin and an ID pin, the cover comprising:
    a main body for engagably attaching to the shell and covering the opening;
    an elastomeric push button formed on the main body, the elastomeric push button configured for powering on or off the USB electronic device, the elastomeric push button including two metal pins connected with each other and configured for short-circuiting the GND pin to the ID pin when the elastomeric push button is depressed.

2. An electronic device, comprising:
    a shell defining an opening;
    a Universal Serial Bus (USB) connector exposed at the opening, the USB connector including a GND pin and an ID pin,
    a cover comprising:
        a main body attached to the shell for covering the opening;
        an elastomeric push button formed on the main body, the elastomeric push button configured for powering on or off the USB electronic device, the elastomeric push button including two metal pins connected with each other, the metal pins configured for contacting the GND pin and the ID pin respectively, thereby short-circuiting the GND pin to the ID pin when the elastomeric push button is depressed.

* * * * *